(12) United States Patent
Hampo et al.

(10) Patent No.: US 8,743,556 B2
(45) Date of Patent: Jun. 3, 2014

(54) PRINTED CIRCUIT BOARD CONNECTION ASSEMBLY

(71) Applicant: Lear Corporation, Southfield, MI (US)

(72) Inventors: Richard J. Hampo, Plymouth, MI (US); Slobodan Pavlovic, Novi, MI (US); Nadir Sharaf, Bloomfield Township, MI (US); Rutunj Rai, Canton, MI (US); Aftab Ali Khan, Dearborn, MI (US)

(73) Assignee: Lear Corporation, Southfield, MI (US)

( * ) Notice: Subject to any disclaimer, the term of this patent is extended or adjusted under 35 U.S.C. 154(b) by 0 days.

(21) Appl. No.: 13/866,557

(22) Filed: Apr. 19, 2013

(65) Prior Publication Data

US 2013/0230991 A1 Sep. 5, 2013

Related U.S. Application Data

(63) Continuation of application No. 13/209,870, filed on Aug. 15, 2011, now Pat. No. 8,446,733.

(60) Provisional application No. 61/416,968, filed on Nov. 24, 2010.

(51) Int. Cl.
*H01R 9/00* (2006.01)

(52) U.S. Cl.
USPC .......................................................... 361/775

(58) Field of Classification Search
USPC ............... 439/857, 75, 858, 68; 361/775, 776
See application file for complete search history.

(56) References Cited

U.S. PATENT DOCUMENTS

| | | | |
|---|---|---|---|
| 3,663,931 A * | 5/1972 | Brown | 439/75 |
| RE31,704 E * | 10/1984 | Hester | 361/399 |
| 4,703,397 A | 10/1987 | Minoura et al. | |
| 4,767,342 A * | 8/1988 | Sato | 439/78 |
| 5,064,379 A | 11/1991 | Ryll et al. | |
| 5,076,796 A | 12/1991 | Kusayanagi et al. | |
| 5,677,830 A | 10/1997 | Nogas et al. | |
| 5,788,539 A * | 8/1998 | Fedder | 439/682 |
| 5,956,835 A | 9/1999 | Aksu | |

(Continued)

FOREIGN PATENT DOCUMENTS

EP 2034807 A3 1/2010

OTHER PUBLICATIONS

"Payton Planar Magnetics Introduces a Line of Low Profile Resonant Inductors", Payton America, Inc., Feb. 2011, 1 page.

(Continued)

*Primary Examiner* — Phuong Dinh
(74) *Attorney, Agent, or Firm* — Brooks Kushman P.C.

(57) ABSTRACT

In at least one embodiment, a vehicle power module comprises a first printed circuit board (PCB) including a first plurality of electrical components for providing a first voltage and a second voltage. The vehicle power module further comprises a second PCB including a second plurality of electrical components, the second PCB being spaced away from the first printed circuit board and a first connector assembly being coupled to the first PCB and to the second PCB for providing the first voltage to the second PCB. The vehicle power module further comprises a second connector assembly being coupled to the first PCB and to the second PCB for providing the second voltage to the second PCB. The first connector assembly provides the first voltage of up to 14V and the second connector assembly provides the second voltage of 200V or greater.

6 Claims, 3 Drawing Sheets

(56) References Cited

U.S. PATENT DOCUMENTS

| | | |
|---|---|---|
| 6,091,604 A | 7/2000 | Plougsgaard et al. |
| 6,291,780 B1 | 9/2001 | Schleife et al. |
| 6,431,879 B2 | 8/2002 | Brekosky et al. |
| 6,520,789 B2 | 2/2003 | Daugherty, Jr. et al. |
| 6,690,582 B2 | 2/2004 | Sumida |
| 6,906,266 B2 | 6/2005 | Verrigni |
| 7,025,640 B2 | 4/2006 | Eichorn et al. |
| 7,035,105 B2 | 4/2006 | Yamaguchi |
| 7,417,861 B2 | 8/2008 | Kikuchi et al. |
| 7,643,297 B2 | 1/2010 | Tominaga et al. |
| 7,733,650 B2 | 6/2010 | Okayama et al. |
| 2008/0218988 A1 | 9/2008 | Burns et al. |
| 2009/0316377 A1 | 12/2009 | Peck |
| 2011/0076901 A1 | 3/2011 | Glick et al. |

OTHER PUBLICATIONS

German Office Action for Application No. DE 10 2011 087 033.4, mailed Feb. 22, 2013, 10 pages.

* cited by examiner

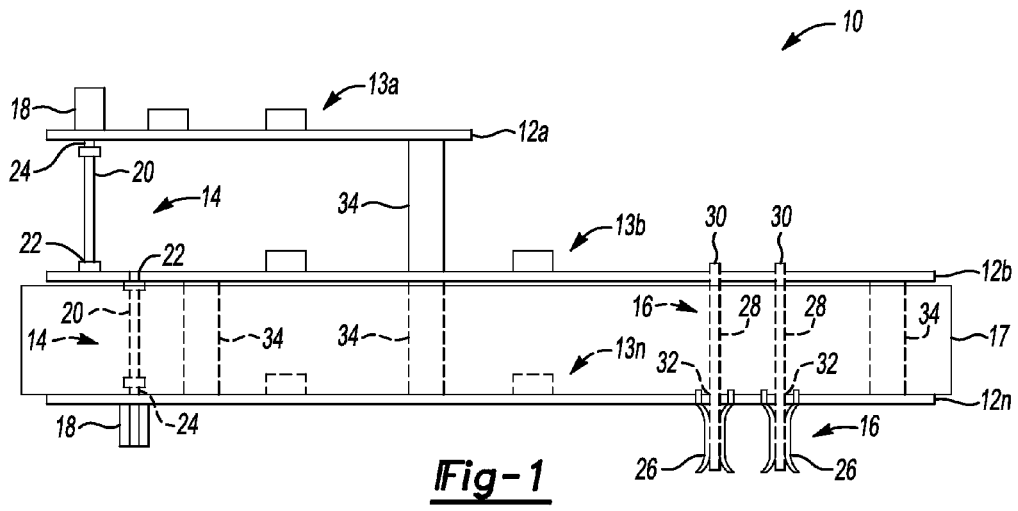
Fig-1
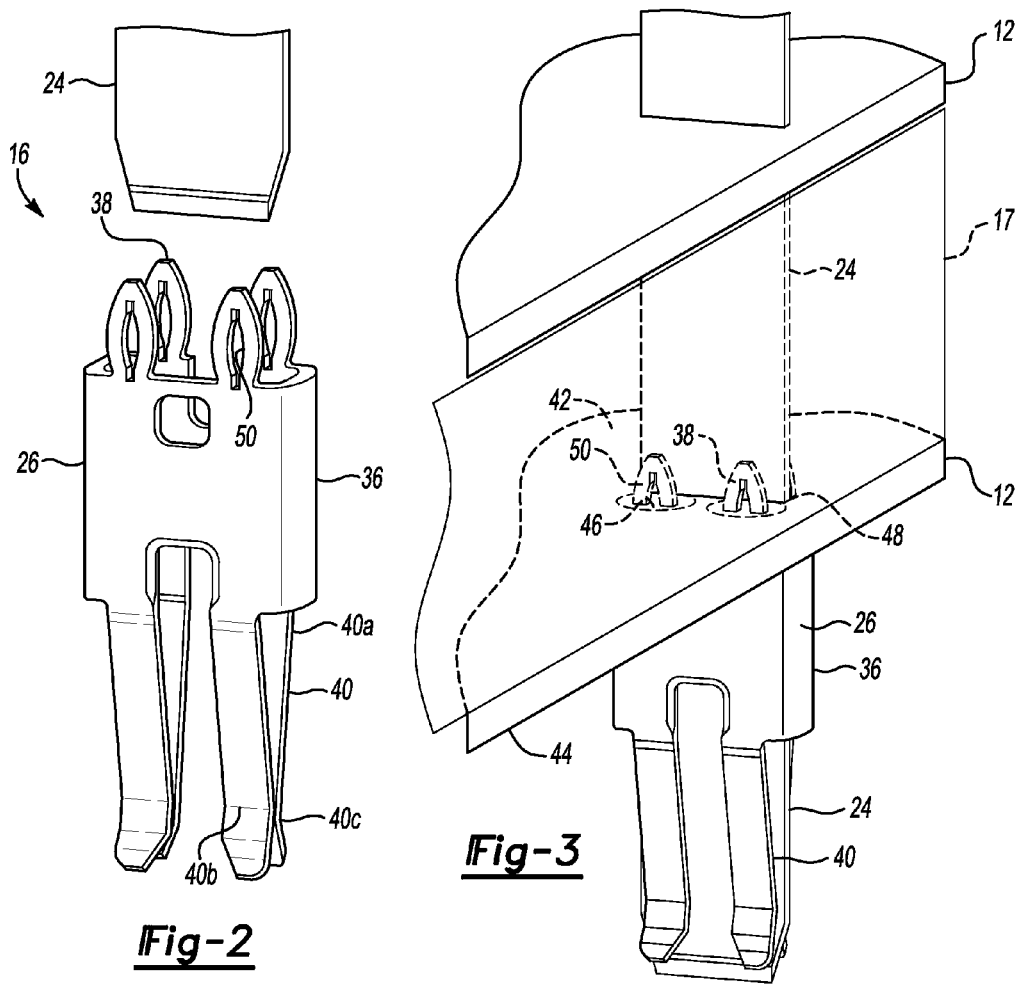
Fig-2
Fig-3

PRINTED CIRCUIT BOARD CONNECTION ASSEMBLY

CROSS-REFERENCE TO RELATED APPLICATIONS

This application is a continuation of U.S. application Ser. No. 13/209,870 filed Aug. 15, 2011, which, in turn, claims the benefit of U.S. provisional Application No. 61/416,968 filed Nov. 24, 2010, the disclosures of which are incorporated in their entirety by reference herein.

TECHNICAL FIELD

Embodiments of the present disclosure generally relate to a high power connection assembly in a vehicle.

BACKGROUND

Power converters (or other high power devices) employed in vehicle applications typically consist of discrete components and printed circuit boards (PCBs). In order to make compact packages, not all of the components are mounted to a single PCB. Two or more PCBs are commonly needed to make a complete power converter. Due to this architecture, connections between the PCBs may be needed to electrically couple the components on one PCB to components on another PCB. One method to electrically couple the PCBs to one another is to use wire with ring terminals and bolts for various high power connections and wired connectors for low power signals. A bolted connection between the PCBs may loosen over time due to vibration, thereby potentially causing a failure (due to overheating of the joint) in the device.

Within the power converters, high power transformer may be necessary to assist in the conversion of AC energy into DC energy such that DC based power is stored on one or more batteries in the vehicle. Such high power transformers may also be used in connection with inverter systems. These transformers may transfer DC energy as provided by the vehicle into AC energy for the purpose of providing AC power at a power outlet within the vehicle such that the vehicle operator may plug a laptop computer or other electric device thereto. These transformers are typically coupled to a PCB (within the high power device) via wires such that the high energy provided by the transformers are transferred to other high power electronics on the PCB. The process of coupling wires to the transformer and to various pads or through-hole connection points on the PCB may be complicated and may be prone to fail over time.

SUMMARY

In at least one embodiment, a vehicle power module comprises a first printed circuit board (PCB) including a first plurality of electrical components for providing a first voltage and a second voltage. The vehicle power module further comprises a second PCB including a second plurality of electrical components, the second PCB being spaced away from the first printed circuit board and a first connector assembly being coupled to the first PCB and to the second PCB for providing the first voltage to the second PCB. The vehicle power module further comprises a second connector assembly being coupled to the first PCB and to the second PCB for providing the second voltage to the second PCB. The first connector assembly provides the first voltage of up to 14V and the second connector assembly provides the second voltage of 200V or greater.

In at least another embodiment, a vehicle power module is provided. The vehicle power module comprises a first printed circuit board (PCB) including a first plurality of electrical components for enabling transmission of electrical power and a second PCB including a second plurality of electrical components for electrically communicating with the first plurality of electrical components, the second PCB being spaced away from the first printed circuit board. The vehicle power module further comprises a heat dissipation device positioned between the first PCB and the second PCB for discharging heat from at least one of the first plurality of electrical components and the second plurality of electrical components. The vehicle power module further comprises a first connector assembly including a first male connector and a first female connector, the first connector assembly being coupled to the first PCB and to the second PCB for enabling transmission of the electrical power from the first plurality of electrical components to the second plurality of electrical components and the female connector being positioned on a side of the second PCB that is opposite to the heat dissipation device.

In at least one embodiment, a vehicle power module is provided. The vehicle power module comprises a transformer for providing a high voltage and a printed circuit board (PCB) for receiving the high voltage. The vehicle power module further comprises a connector assembly coupled to the transformer and to the PCB. The connector assembly including a male connector; and a female connector including at least two beam terminals defining a cavity to receive the male connector, the female connector being arranged to secure the male connector to enable transfer of the high voltage to the PCB.

BRIEF DESCRIPTION OF THE DRAWINGS

The embodiments of the present disclosure are pointed out with particularity in the appended claims. However, other features of the various embodiments will become more apparent and will be best understood by referring to the following detailed description in conjunction with the accompany drawings in which:

FIG. 1 generally depicts a first apparatus in accordance to one embodiment of the present disclosure;

FIG. 2 generally depicts a second connector assembly in more detail in accordance to one embodiment;

FIG. 3 generally depicts the second connector assembly as positioned on a PCB in accordance to one embodiment;

DETAILED DESCRIPTION

Figure 4:
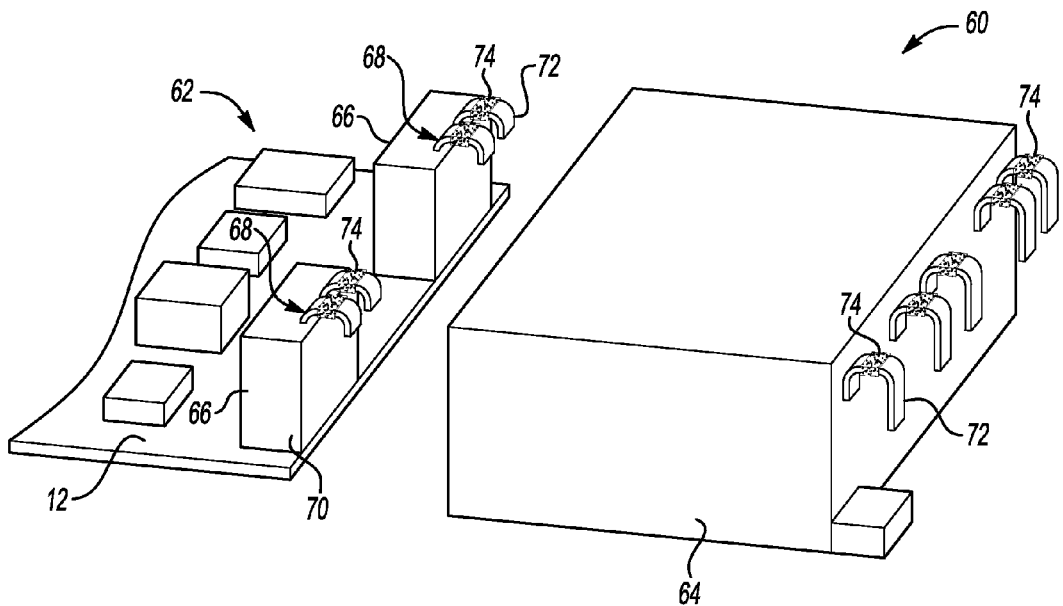
FIG. 4 generally depicts a second apparatus in accordance to one embodiment of the present disclosure.

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

The embodiments of the present disclosure provide for, but not limited to, male and female connectors (both for high power and low power) that are soldered to PCBs for electrically coupling the same. These male and female connector systems may be fully qualified as separate products. In addition, the embodiments of the present disclosure provide for, but not limited to, coupling various high power components (e.g., a transformer or other suitable device) to the PCB through a connector assembly. The aforementioned embodiments may, among other things, eliminate bolted or wire connections when stacking PCBs on one another and/or eliminate wire connections when coupling bigger or heavier high power electrical devices to the PCB for the purpose of high-energy transfer.

FIG. 1 depicts a first apparatus 10 for use in connection with a vehicle. In one example, the apparatus 10 may be implemented as a power module that is generally used in connection with a hybrid or electric vehicle. It is recognized that the apparatus 10 may be used in any device that enables the transmission of high voltage energy and/or low voltage energy. The apparatus 10 includes one or more printed circuit boards (PCBs) 12a-12n (or "12") and a plurality of electrical components 13a-13n (or "13") positioned respectively thereon. The plurality of electrical components 13 on the PCB 12 are generally in electrical communication with one another and enable the transfer of high voltage and low voltage energy within the first apparatus 10.

The PCBs 12a-12n are spaced apart from one another and are configured to transfer electrical signals (e.g., low energy) and/or electrical power (i.e., high energy) to one another. At least one first connector assembly 14 and at least one second connector assembly 16 electrically couple the PCBs 12a-12n to one another. The PCBs 12a-12n may enable the transfer of electrical signals (e.g., up to 14 V) via the at least one first connector assembly 14 and electrical power (e.g., a voltage that is greater than 200 V (e.g., 800 V, etc.)) via the at least one second connector assembly 16. The first apparatus 10 further includes a cold plate (or heat dissipation device) 17 that is positioned below the PCB 12b and above the PCB 12n. The cold plate 17 is generally part of a fluid cooling system that operates to cool various electrical components within the first apparatus 10 that generate large amounts of heat in response to transferring the high amount of energy. The relevance of the cold plate 17 will be discussed in more detail in connection with FIG. 3. The heat dissipation device 17 may or may not include the use of fluid for purposes of cooling the various electrical components.

Each first connector assembly 14 includes a female connector 18 and a male connector 20 (or pin). Each male connector 20 includes a first end 22 and a second end 24. The first end 22 is fixed (soldered) to a particular PCB 12 while the second end 24 is received and secured by the female connector 18. Each female connector 18 is soldered to the particular PCB 12. The first connector assembly 14 is generally configured to enable the transfer of electrical signals between the PCBs 12a-12n.

Each second connector assembly 16 includes a female connector 26 and a male connector 28 (or pin). The male connector 28 includes first and second ends 30, 32. The first end 30 is fixed (soldered) to the PCB 12 while the female connector 26 receives and secures the second end 32. The second connector assembly 16 is generally configured to enable the transfer of (high) electrical power between the PCBs 12a-12n. In one example, the second connector assembly 16 is configured to enable anywhere from between 40 to 60 amps of current to pass between the PCBs 12a-12n. This will be discussed in more detail below.

One or more mechanical supports 34 are provided for supporting PCB 12a with respect to PCB 12b and for supporting PCB 12b with respect to PCB 12n. It is recognized that the size of the mechanical support 34 may vary based on the desired criteria of a particular implementation. It is also recognized that the number of the mechanical supports 34 used within the apparatus 10 may vary based on the desired criteria of a particular implementation.

As depicted, the at least one second connector assembly 16 enables high energy transfer between the PCBs 12a-12n without incorporating various bolt connections or wire connections therebetween. Such a condition may increase connection reliability and reduce process complexity when the first apparatus 10 is manufactured. For example, the use of a bolted connection adds additional joints or connection points which may increase the potential for failure at such points. In addition, a bolted connection generally requires the use of a tool that applies a torque thereto to tighten the connection. The application of torque may not be properly controlled or there may be over torque conditions that may jeopardize the physical connection of the bolted connection thereby reducing the integrity of the connection point. Such a condition may lead to undesired open circuits at these points. The use of the first and the second connector assemblies 14, 16 to couple the PCBs 12 to one another does not require special equipment to establish a connection.

FIG. 2 generally depicts the second connector assembly 16 in more detail in accordance to one embodiment. The male connector (pin) 24 is generally formed into a blade terminal. The width of the pin 24 may be 6.3 mm or greater to enable the transfer of high current energy. The female connector 26 includes a main body 36, at least one board attachment point 38, and a plurality of beam members 40. Each beam member 40 is compressively biased against one another other at a point 40a.

The pin 24 (when being mated to the female connector 26) is configured to pass through the board attachment points 38, the main body 36 and at least a portion of the beam members 40. The pin 26 is slideably received by the beam members 40 is engaged at the point 40c. The pin 24 is capable of being secured/fastened to the female terminal 26 to enable energy transfer when coupled and powered.

FIG. 3 generally depicts the second connector assembly 16 as positioned on the PCB 12 in accordance to one embodiment. The PCB 12 generally includes a top side 42 and a bottom side 44. The PCB 12 defines a plurality of through holes 46 each being configured to receive a respective board attachment point 38. As shown, the female connector 26 is generally inserted into the bottom side 44 of the PCB 12 such that the beam members 40 are positioned on the bottom side 44 thereof. The PCB 12 generally defines a cavity 48 for enabling the pin 24 to pass from the top side 42 of the PCB 12 to the bottom side 44 such that the pin 24 is received and secured by the beam members 40.

The positioning of the female connector 26 on the bottom side 44 of the PCB 12 may provide an operator an indication as to whether the male connector 28 is properly connected to the female connector 18. For example, as shown in FIG. 3, the cold plate 17 is generally positioned between the PCB 12b and the PCB 12n. Due to the position of the cold plate 17 within the first apparatus 10, an operator may have an obstructed view and may not be able to determine if the male connector 28 is fully engaged with the female connector 26 (e.g., the operator would be performing a blind operation). By positioning the female connector 26 on the bottom side 44, an operator may have an unobstructed view of the connection to ensure such connectors 26, 28 are properly engaged. In addition, the positioning of the female connector 26 on the bottom side 44 of the PCB 12 may reduce height between the PCBs 12. Such a condition may decrease the overall package size of the first apparatus 10 which may allow for additional space in the vehicle for other vehicle components. Likewise, the positioning of the female connector 26 on the bottom side 44 of the PCB may improve alignment when inserting the male connector 24 into the female connector 26.

Each board attachment point 38 generally defines an opening 50. Solder may be applied to the each board attachment point 38 and is received at the openings 50 and at the through holes 46 to secure the female connector 26 to the PCB 12. It is recognized that a housing (not shown) may be formed around the female connector 26 to prevent undesired contact from other components in the first apparatus 10.

As noted above, the second connector assembly 16 may enable high current transfer in the range of 40 to 60 A. It is recognized that the second connector assembly 16 may exceed the foregoing current range as noted above and that such a current range may be limited by the thickness of the traces used within the first apparatus 10. Likewise, the current range may be limited due to various characteristics of the female and male connector 26, 28. For example, the overall width of the male connector 24 may be increased to enable increased current flow. In addition, it is recognized that each board attachment point 38 on the female connector 26 generally enables anywhere from 10-15 A of current flow. Increasing the overall number of board attachment points 38 on the female connector 26 may increase the current carrying capability thereof.

FIG. 4 generally depicts a second apparatus 60 in accordance to one embodiment. The second apparatus 60 may be implemented as a power module that is generally used in connection with a hybrid or electric vehicle. It is recognized that the apparatus 60 may be used in any device that enables the transmission of high voltage energy and/or low voltage energy. In one example, the first apparatus 10 and the second apparatus 60 may be implemented together, within a power module for enabling the transmission of high voltage energy and/or low voltage energy.

The second apparatus 60 includes the PCB 12, a plurality of electrical components 62, and a transformer 64. The plurality of electrical components 62 interface with the transformer 64 to provide the high voltage energy. The second apparatus 60 includes at least one third connector assembly 66. Each third connector assembly 66 includes a female connector 68 and a connector housing 70 formed around the female connector 68. A plurality of male connectors (or pins) 72 is positioned on the transformer 64. Each female connector 68 is configured to receive a corresponding male connector 72 so that an electrical connection is formed with the plurality of electrical components 62 and the PCB 12. It is recognized that the number of third connector assemblies 66 and the male connectors 72 may vary based on the desired criteria of a particular implementation.

The use of the third connector assembly 66 and the male terminal 66 may obviate the need for conventional connection methods such as wire or bolted connections to couple the PCB and the transformer. The use of the third connector assembly 66 may simplify the assembly of the second apparatus 60. Such a condition may also increase the overall reliability of the second apparatus 60. Additional conventional systems may utilize a transformer that is embedded within the PCB. This type of an implementation may increase manufacturing complexity and increase cost.

The male connector (pin) 72 is generally L-shaped. The width of each pin 72 may be 6.3mm or greater to enable the transfer of high current. A seal 74, such as shrink-wrap or other suitable mechanism is formed over at least a portion of the male connector 72. The seal 74 generally provides voltage isolation between the connectors (e.g., the female connector 68 and/or the male connector 72) and the housing 70. It is recognized that the seal 74 may be implemented as a molded plastic part or other suitable mechanism.

Figure 5:
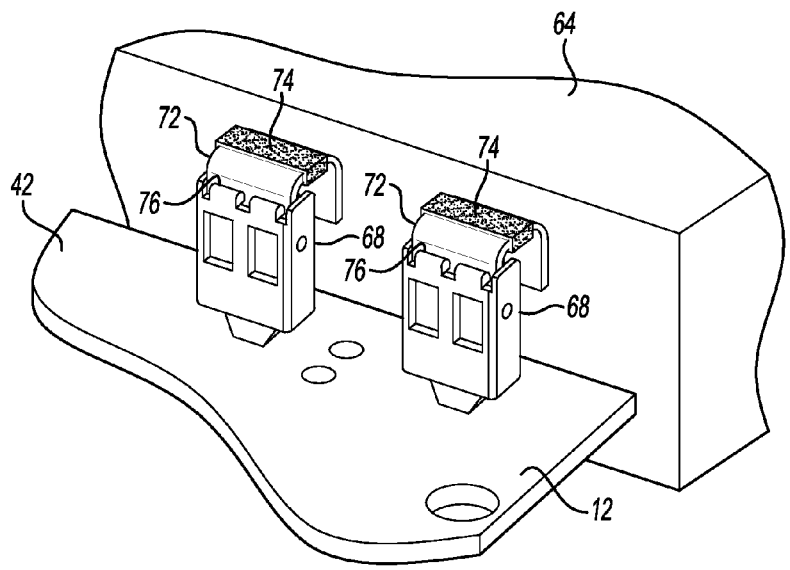
FIG. 5 generally depicts the third connector assembly as positioned on the PCB and a transformer in accordance to one embodiment.
Figure 6:
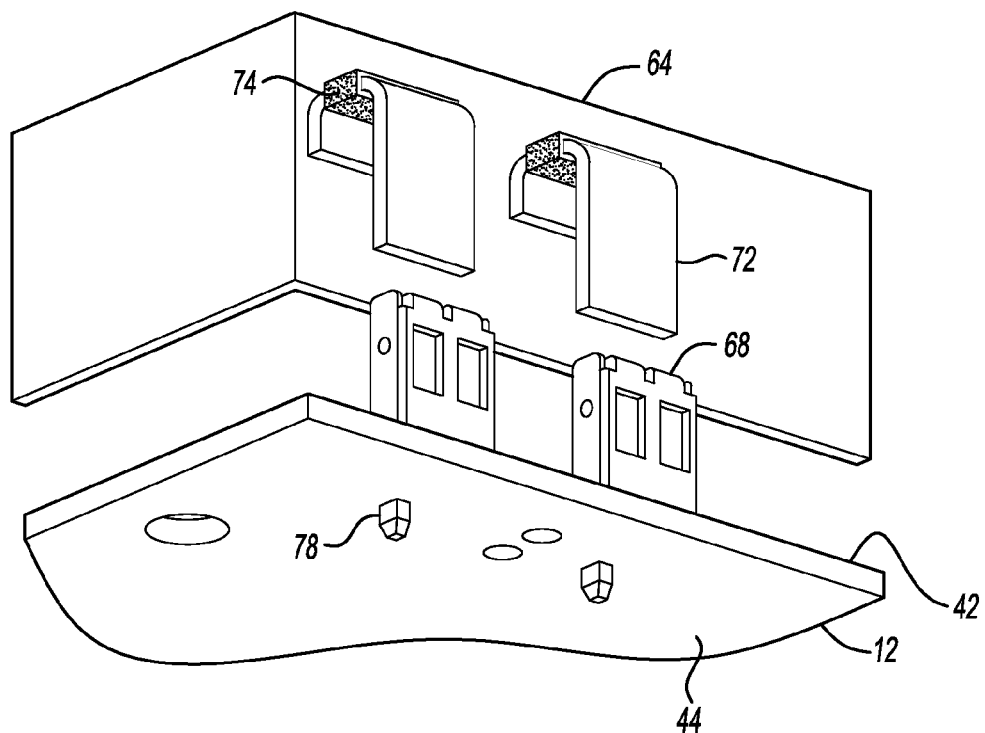
FIG. 6 generally depicts another view of the third connector assembly as positioned on the PCB and on the transformer in accordance to another embodiment.

FIGS. 5-6 generally depict the third connector assembly 66 as positioned on the PCB 12 in accordance to one embodiment. The female connector 68 generally includes beam terminals 76 that are positioned opposite one another for defining a cavity to receive the male connector 72. The female connector 68 includes an attachment point 78 that is secured to a cavity in the PCB 12. As shown, the female terminal 68 is generally positioned on the top side 42 of the PCB 12 while the attachment point 78 protrudes through the bottom side 44 of the PCB 12.

The embodiments of the present disclosure may provide a high power connection system assembly that may be used to connect (i) a number of PCBs that transfer large amounts of electrical power and/or (ii) a transformer to a PCB that also provides a large amount of electrical power. The high power connection assembly may (1) provide male and female connectors that maintain correct contact pressure regardless of the assembly procedure, while the quality of bolted connection may vary due to bolt torque; (2) not require special equipment to mate the male and female connectors while a torque controlled tool may be needed to make a bolted connection; (3) not require wires when the male and female connectors of the present disclosure are used, this may result in a lower manufacturing cost; and (4) not require hand assembly as the male and female connectors may be soldered to the PCBs using normal PCB soldering processes. It is recognized that the embodiments of the present disclosure may provide for additional aspects that are not disclosed herein. The aforementioned listing is given to provide a sample of various aspects offered by the present disclosure and in no way is to be construed as a complete or exhaustive list.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A vehicle power module comprising:
   a transformer for providing a high voltage;
   a printed circuit board (PCB) for receiving the high voltage; and
   a connector assembly coupled to the transformer and to the PCB, the connector assembly including:
      a male connector directly coupled to the transformer independent of a cable or wires;
      a female connector including at least two beam terminals defining a cavity to receive the male connector, the female connector receiving the male connector to enable transfer of the high voltage to the PCB.

2. The vehicle power module of claim 1 wherein the at least two beam terminals includes a first beam terminal and a second beam terminal and wherein the first beam terminal is positioned opposite to the second beam terminal to form the cavity.

3. The vehicle power module of claim 2 wherein the first beam terminal and the second beam terminal compress against the male connector to couple the transformer to the PCB.

4. The vehicle power module of claim 2 wherein the first beam terminal and the second beam terminal is arranged to engage and secure the male connector such that the transformer is coupled to the PCB without a bolted connection.

5. The vehicle power module of claim 2 wherein the first beam terminal and the second beam terminal is arranged to engage and secure the male connector such that the transformer is coupled to the PCB without a wire connection.

6. The vehicle power module of claim 1 wherein the female connector includes an attachment point that protrudes completely through the PCB to secure the female connector to the PCB and to couple the transformer to the PCB when the female connector receives the male connector.

* * * * *